(12) United States Patent
Kojori et al.

(10) Patent No.: US 7,777,370 B2
(45) Date of Patent: Aug. 17, 2010

(54) INTEGRATED GATE DRIVE FOR USE IN CONTROL AND PROTECTION OF POWER MODULES

(75) Inventors: Hassan Ali Kojori, Mississauga (CA); Robert D. Paton, Caledon (CA); Andrew Eftychiou, Toronto (CA)

(73) Assignee: Honeywell International Inc., Morristown, NJ (US)

( * ) Notice: Subject to any disclaimer, the term of this patent is extended or adjusted under 35 U.S.C. 154(b) by 296 days.

(21) Appl. No.: 12/025,601

(22) Filed: Feb. 4, 2008

(65) Prior Publication Data

US 2008/0272658 A1 Nov. 6, 2008

Related U.S. Application Data

(60) Provisional application No. 60/915,812, filed on May 3, 2007.

(51) Int. Cl.
*H01H 35/00* (2006.01)
(52) U.S. Cl. .................. 307/129; 307/125; 307/127
(58) Field of Classification Search ............. 307/125, 307/127, 129
See application file for complete search history.

(56) References Cited

U.S. PATENT DOCUMENTS

| 4,292,550 | A | | 9/1981 | Onda et al. |
| 4,941,076 | A | * | 7/1990 | Diaz ........................... 363/49 |
| 5,124,595 | A | | 6/1992 | Mandelcorn |
| 5,138,202 | A | | 8/1992 | Shekhawat |
| 5,142,432 | A | | 8/1992 | Schneider |
| 5,900,683 | A | * | 5/1999 | Rinehart et al. ............. 307/129 |
| 6,851,077 | B2 | | 2/2005 | Herzer et al. |
| 2002/0149414 | A1 | * | 10/2002 | Glidden ..................... 327/438 |

FOREIGN PATENT DOCUMENTS

| EP | 1-388-940 A | 2/2004 |
| EP | 1-768-257 A | 3/2007 |

OTHER PUBLICATIONS

Biswas S K et al: "Gate drive methods for 7 IGBTs in bridge configurations" Industry Appliations Society Annual Meeting, 1994., Conference Record of the 1994 IEEE Denver, CO, USA Oct. 2-6, 1994, New York, NY, USA, IEEE. Oct. 2, 1994, pp. 1310-1316, XPO10124238 ISBN: 978-0-7803-1993-6.
European Search Report dated Aug. 1, 2008.
Siegbert Troeger Microelectronics (SE Microelectronics), TD350 Advanced IGBT/MOSFET Driver Data Sheet, Aug. 2004, Revision 1.

* cited by examiner

*Primary Examiner*—Fritz M Fleming
(74) *Attorney, Agent, or Firm*—Oral Caglar, Esq.

(57) ABSTRACT

A method and apparatus for providing isolated high and low direct current power supplies to a Power Device using a sealed high Power Device Gate Driver having a single transformer, wherein the Gate Driver integrates the power supplies, gating control and gate control, gate drive and Power Device diagnostics into a sealed unit, wherein the unit may be further sealed hermetically.

14 Claims, 7 Drawing Sheets

INTEGRATED GATE DRIVE FOR USE IN CONTROL AND PROTECTION OF POWER MODULES

CROSS REFERENCE TO RELATED APPLICATIONS

This present application claims benefit of U.S. Provisional Patent Application Ser. No. 60/915,812 filed May 3, 2007, which is incorporated herein by reference in its entirety and for all purposes.

BACKGROUND OF THE INVENTION

The present invention relates generally to a magnetically coupled Gate Driver for providing transformer isolated high and low control and gate drive to Power Devices, such as IGBT or MOSFET, using a single transformer and no interface opto-couplers for the Gating or Fault signals. More particularly, the Gate Driver of the present invention may be hermetically sealed and integrates high and low direct current power supplies, gating control, gate drive and Power Device diagnostics into a sealed Integrated Power Device Package. This eliminates the need for opto-coupler or I/O (input/output) pin connections or wires through the wall of the device package which would increase the complexity and cost of achieving a hermetic Power Device. The magnetic coupling method described in this invention facilitates integration of a Gate Driver with a High Power Device Module and simplifies hermetic sealing of both from ambient environment by eliminating the number of control interfaces/pins to and from the Gate Driver in hermetic and non hermetic applications.

In typical Power Device applications, High Power Device Modules (HPSM), such as Insulated Gate Bipolar Transistors (IGBT) or Metal-Oxide-Semiconductor Field-Effect Transistors (MOSFET), are controlled via commercial off-the-shelf (COTS) Gate Drivers or custom discrete designs. A typical COTS driver is described in, for example, the TD350 advanced MOSFET/IGBT Driver brochure, Siegbert Troeger, Silica, Germany. The TD350 brochure shows a 14-pin package, the main advantages of COTS driver chips are simplified design, reduce cost and area.

U.S. Pat. No. 6,851,077 describes a monolithic integrated quadruple-Gate Driver having a three-phase bridge circuit for a direct gate control and monitoring of several semiconductor switches in a converter, wherein an example of the driver described shows a 28-pin small outline package.

HPSMs, with or without Integrated Gate Drivers, are frequently used in a variety of terrestrial and non-terrestrial operating conditions and are subject to degradation and failure from atmospheric and non-atmospheric contaminants. To maintain operational integrity, HPSMs must be sealed against such contaminants. The process of sealing an HPSM is difficult and expensive, requiring all pin connections into and out of the HPSM to be prepared and sealed prior to use. In HPSMs with Integrated Gate Drivers, reducing or eliminating the number of electrical connections in and out of the HPSM is crucial in achieving a reliable, hermetically sealed, low cost HPSM. As shown in the TD350 brochure and in U.S. Pat. No. 6,851,077, typical Gate Drivers have multiple connections both into and out of the module, thereby sealing each unit before putting a unit into operation makes each unit more expensive. Moreover, hermetically sealing each unit to keep out humidity or for use under reduced atmospheric pressure or in a vacuum, such as outer space, is significantly more difficult and expensive.

U.S. Pat. No. 5,142,432 shows how one can transfer V+ power supply plus gating and/or PHM signal through a single transformer. However, the '432 patent does not show how V− for turn off is derived nor does it propose or discuss how to realize a hermetic Gate Driver plus Power Device.

The TD350 brochure shows that the TD350 Gate Driver utilizes a single transformer. U.S. Pat. No. 5,900,683 describes an isolated Gate Driver having a plurality of high frequency pulse transformers. The isolated Gate Driver described in U.S. Pat. No. 5,900,683, includes a primary circuit having a voltage source of a first voltage potential wherein the primary circuit constantly switches the voltage source to generate first and second load signals based on the control signals. The first load signal modulates at a first frequency for enabling the transistors and the second load signal modulates at a second frequency, different from the first frequency, for disabling the transistors. Typically, COTS Gate Drivers utilize one or two high frequency transformers and additional complex circuitry to provide a positive high power voltage to bias the Power Device conductive and an isolated negative low power voltage as a guard voltage to bias the Power Device nonconductive.

Although typical COTS Gate Drivers have generally incorporated various Gate Driver and device diagnostics and other Prognostics Health Monitoring (PHM) as a feature, such features require additional I/O circuitry and methods of signal isolation. For example, U.S. Pat. No. 5,142,432 describes an isolated Gate Driver having a single transformer, which electrically isolates logic level and power circuits of a power transistor drive circuit and also detects power circuit fault conditions at the isolated, logic level side of the circuit. When a fault condition exists, a current increase results in a voltage increase at output of drivers, which apply the gating signals to the primary winding of the isolation transformer. Voltage at the output of the drivers is periodically sensed to determine if it exceeds a threshold level. When the threshold level is exceeded, a fault signal indicates to the controller that a fault condition has occurred. In general, implementation of such features typically requires additional components, additional pin connections and increased board space, thus adding to cost and weight and potential unreliability of the Gate Driver. Moreover, any additional I/O pin connections make the unit correspondingly difficult and expensive to seal. As one can easily understand, an application environment requiring a hermetically sealed unit having onboard diagnostics makes the cost to hermetically sealing the unit significant.

As stated above, U.S. Pat. No. 5,900,683 describes an isolated Gate Driver having a plurality of high frequency pulse transformers. U.S. Pat. No. 6,851,077 further describes hybrid IGBT control circuits with galvanic separation of the primary side from the secondary side by means of opto-couplers, a fast opto-coupler is used for the signal path, and a usually slower second opto-coupler is used for error messages. Although U.S. Pat. No. 6,851,077 describes the advantage of transformers versus opto-couplers, the monolithic integrated quadruple-Gate Driver described requires potential separation for the three-phase bridge circuits which is achieved by means of opto-couplers.

Generally, typical Gate Drivers may use one or more transformers and optionally use one or more opto-couplers. For example, a typical implementation uses a single transformer for power and two opto-couplers, one opto-coupler for the gating signal and one opto-coupler for detecting Gate Driver fault. Such implementation is illustrated in FIG. 1.

With regard to FIG. 1, there is shown a block diagram/schematic representation of a Gate Driver 100 with one transformer TR1 and two opto-couplers, U1A and U1B. Symmetric square-wave power may provide the gating power to the Gate Driver 100 through transformer TR1, rectifier diodes D1, D2 and D3 and filtering capacitors C1 and C2 to generate V+ and V− for the Gate Driver 100. A UV Detection block 102 may monitor the V+ and V− voltages and generate a fault signal 104 if either V+ or V− is above or below certain limits.

A de-saturation detection block 106 may compare the state of the Power Device Q3 to the commanded state. For example, when the Power Device is commanded ON, Voltage 108 (with respect to the COMMON REF, 122) should be less than 3V. In the event of de-saturation, this Voltage 108 will be many times higher than 3V. When this condition occurs the De-Saturation Detection generates a fault signal by changing the state of signal 120. The Fault Signal Processing block receives this signal and generally performs two functions, a) sends a signal to the Gating Signal Processing block so that the Power Device is commanded OFF and b) sends a fault signal through the U1B opto-coupler for processing outside the Gate Driver, Fault Signal 112.

In general, the fault signal processing block 110 may process one or more generated fault signals and generate a common fault signal 112 sent outside the Gate Driver 100 through opto-coupler U1B and at the same time change the state of the Gate Driver output in a manner that protects the Power Device Q3.

A gating signal processing block 114 may determine the state of the Gate Driver output based on the gating signal 116 and the fault signal processing block 110. MOSFETS Q1 and Q2 are the final drive stages of the Gate Driver 100, when Q1 is conducting, V+ is applied to the gate of Power Device Q3, when Q2 is conducting, V− is applied to the Gate of Power Device Q3.

The gating signal block 116 generates an ON/OFF command outside the Gate Driver 100, typically the ON/OFF command is a square two-level pulse where voltage level 1 is a command to turn the Gate Driver 100 ON and voltage level 2 is a command to turn the Gate Driver 100 OFF. It's important to note that the Gating and Fault Signals, 116 and 112 respectively, are outside the Gate Driver 100 and are floating with respect to the Gate Driver 100, hence the need of the opto-couplers, U1A and U1B, to maintain isolation.

The Fault Signal Processing block 110 receives one or more fault signals, in this case two fault signals, 104 from the UV Detection block and 120 from the De-saturation Detection block, and typically generates a single fault signal that turns the Power Device OFF and signals outside the Gate Driver that a fault has occurred. The fault signal is typically a two-level signal, where voltage level 1 represents the normal state of the Gate Driver 100 and voltage level 2 represents a fault state.

Other implementations have been reported in prior art which use no opto-couplers and two transformers, one transformer for positive voltage (V+) and turn-on (ON gating status) signal and one transformer for negative voltage (V−) and turn-off (OFF gating status) signal. A possible implementation may use no opto-couplers and two transformers; i.e., one transformer for power and one transformer for the gating signal with no diagnostics. Another possible implementation may use one opto-coupler and two transformers, one transformer for power, one transformer for the gating signal and the opto-coupler for signaling a Gate Driver fault.

As can be seen, there remains a need for a method for providing an isolated power supply, gating signal and detecting Gate Driver fault status or other status, to and from a Power Device with a Gate Driver that is relatively simple, inexpensive and has the ability to be easily hermetically sealed when integrated with the Power Device.

SUMMARY OF THE INVENTION

The present invention generally relates to interfacing a gating signal with a Gate Driver and a high Power Device in a safe, reliable and cost-effective manner, having a gating signal block; a single transformer primary winding block receiving alternating current from the gating signal block; and a Gate Driver unit electrically coupled to and physically isolated from the transformer primary winding block.

The present invention also relates to a Gate Driver for interfacing with a gating signal and a high Power Device, in a safe, reliable and cost-effective manner, having a gating signal block; a single transformer primary winding block receiving alternating current from the gating signal block; and a Gate Driver unit electrically coupled to and physically isolated from the transformer primary winding block for use in a high Power Device module with an integrated Gate Driver.

The present invention also generally relates to a method for using a Gate Driver to interface with a gating signal and a high Power Device, in a safe, reliable and cost-effective manner, by providing an alternating current to a single transformer primary winding block; and providing the alternating current to a sealed gate drive unit using the single transformer primary winding block, wherein the single transformer primary winding block is electrically coupled to and physically isolated from the sealed Gate Driver unit.

These and other features, aspects and advantages of the present invention will become better understood with reference to the following drawings, description and claims.

DETAILED DESCRIPTION OF THE INVENTION

Figure 1:
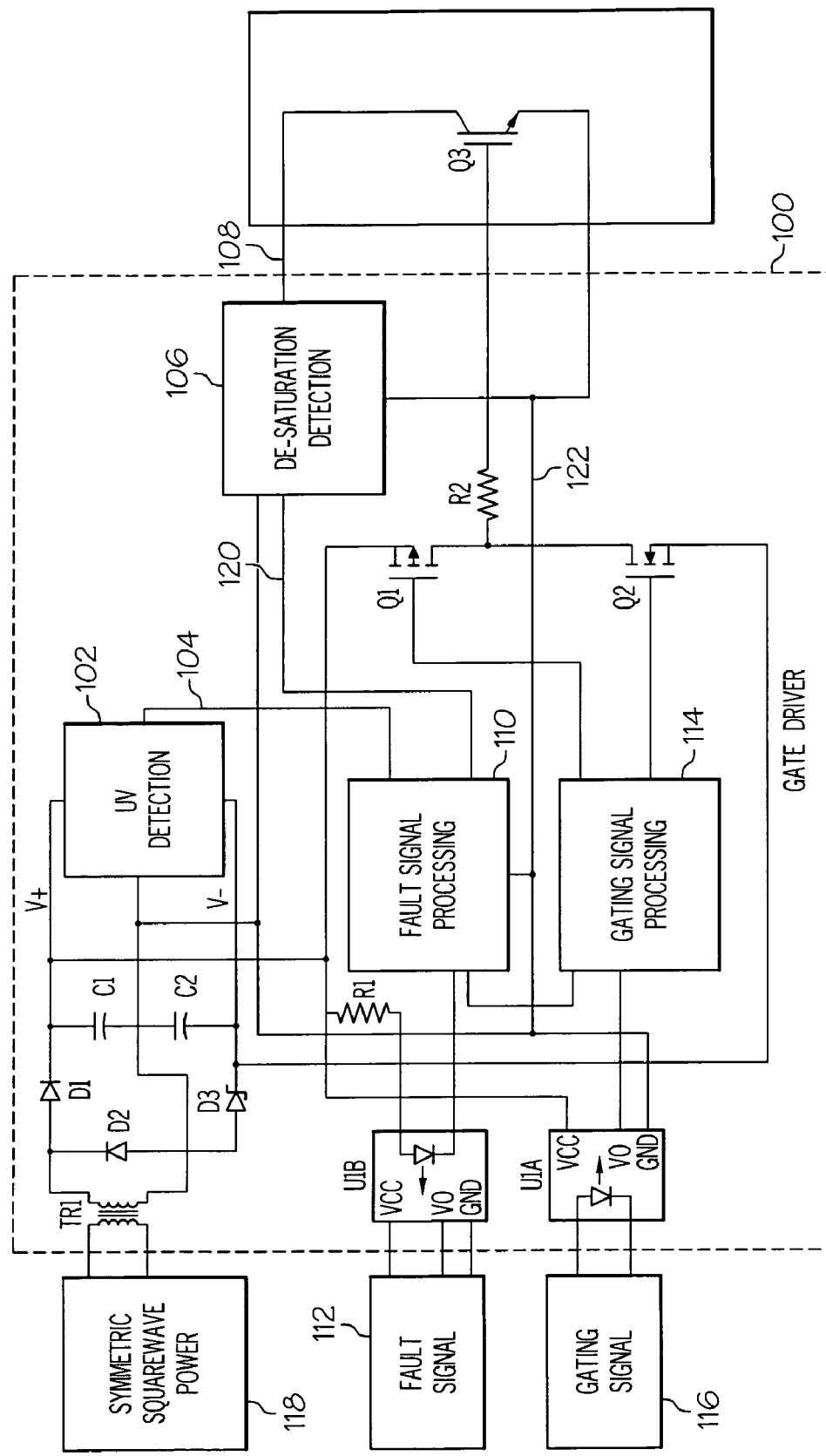
FIG. 1 is a block/circuit diagram of a typical Gate Driver with 1 Transformer and 2 Opto-couplers.

The following detailed description is of the best currently contemplated modes of carrying out the invention. The description is not to be taken in a limiting sense, but is made merely for the purpose of illustrating the general principles of the invention, since the scope of the invention is best defined by the appended claims.

In high power electronic applications, the Gate Driver needs to be installed very close (in most cases, direct-mount at Power Device control-pins) to the Power Devices. This very close proximity is required to avoid degradation of gating signals due to parasitic inductances and/or prevent noise/delay to gating patterns.

The present invention presents the concept of integrating the Gate Driver in a hermetic package, which not only puts the Gate Driver right on the device, but also protects the Gate Driver from harsh environmental conditions such as extreme high/low temperatures, and provides protection against condensation and contamination. Other significant benefits include improved reliability, ease of repair, maintenance and trouble-shooting which altogether would result in reduced overall Life Cycle Cost, particularly for aerospace power conditioning applications. As it relates to prior art and a hermetic integrated Gate Driver plus Power Device, the number of pins of a COTS Gate Driver is not as relevant. A more relevant number (for hermetic Gate Driver plus Power Device) can be derived based on isolated power supply pins and gating signal (into Gate Driver) and diagnostic/PHM in and/or out of the gate-driver. In general one would need two isolated power supplies with three pins (i.e., one V+, one V− and one ground). Then one would need one isolated gating signal with respect to the same ground. This ground for example would be connected to the emitter or source of an n-channel IGBT or MOSFET. Then, one needs isolated diagnostics (or PHM), which requires extra opto-couplers, e.g., for communicating even only one fault signal, one would need one more wire. Incorporation of numerous pins through a hermetic wall is a difficult task due to temperature mismatch among the many different materials that have to be used such ceramic, glass, copper/aluminum or other type of metal pin, glue and corrosion protective covers on pins and outside package, as required.

In the present invention, all the I/O pins (ie, power supplies, ground, gating, and diagnostics) which complicate the manufacturing of hermetically sealed interfaces may be eliminated. The present invention includes an integrated Gate Driver plus Power Device and the use of magnetic coupling to achieve power and signal communication in a wireless mode through the hermetic barrier. The present invention includes two methods for turning the device on with V+ and off with V−, the methods including a) one with introducing a second winding with a different turns-ratio to get V−; and b) using different voltage levels of V+ and V− with one single winding and balancing the volt-second product of the PWM pattern voltage across the primary/secondary of the said transformer, as will be explained in detail in subsequent sections.

The gate drive apparatus of the present invention and method of use thereof is applicable, but not limited, to high Power Device systems where the Gate Driver is integrated with a Power Device to form a hermetic or non-hermetic integrated Gate Driver High Power Device Module without the use of pins or wires for the Gating Power, Signals and Diagnostics. The present invention provides an optimized configuration for a Gate Driver that may be conveniently used at reduced expense over other COTS Gate Drivers which require sealing or hermetic sealing prior to use. The Gate Driver of the present invention may be used in various terrestrial and non-terrestrial applications without additional sealing against gross contaminants and, depending on the application, may be hermetically sealed.

The present invention differs from the prior art by providing a relatively inexpensive, commercial-off-the-shelf (COTS) or discrete implementation, Gate Driver that can be integrated with a Power Device and be sealed or as a stand alone Gate Driver conventionally wired to the Power Device.

The present invention also differs from the prior art by having a single transformer to provide high and low direct current voltage power supplies (i.e., V+ and V−) without extra I/O pins or wires. The present invention further differs from the prior art by providing a gate drive unit that integrates the high and low voltage direct current power supplies, gating control and gate control, gate drive and Power Device diagnostics into a sealed unit without the need for pin connections or opto-couplers. The present invention also addresses the key issues of realizing unbalanced positive and negative Gate Driver Power Supplies (i.e., V+ and V−) without using Voltage Regulation (e.g., through local active DC-DC converters or passive zener voltage-drop methods). This approach for Transformer Volts-second balance and transition speed from ON to OFF state and vice versa, when using a single Transformer has not been reported before. In relation to the ON/OFF detection method, amplitude, pulsewidth, frequency, or any combination thereof maybe used to realize the implementation through a single transformer.

One aspect of the Gate Driver having a single transformer includes a transformer having a primary transformer winding physically isolated from a transformer secondary winding, but magnetically coupled through the common core, thus enabling the Gate Driver unit to be hermetically sealed when integrated with the Power Device by eliminating interface pins.

The sealed Gate Driver unit of the present invention also integrates the transformer secondary winding and rectifiers block, the PHM modulator block, the frequency variation detection unit block, the gating control unit block and the Power Device block and implements gating control circuitry and gate control, gate drive and Power Device diagnostic circuitry without the need for opto-coupler or I/O pin connections, thereby providing cost effective sealing and hermeticity for the Gate Driver when integrated with the Power Device.

As will be described with reference to the accompanying drawings, an aspect of the present invention relates to a method of hermetically sealing a Gate Driver having a single transformer with integrated gating control, gate drive and Power Device PHM diagnostics, wherein gating control, the high and low direct current power supply for Power Device turn-on/turn-off bias, the gate control to provide device protection, gate drive function, Power Device and PHM diagnostic signals are provided without the need for opto-coupler or I/O pin connections.

Figure 2:
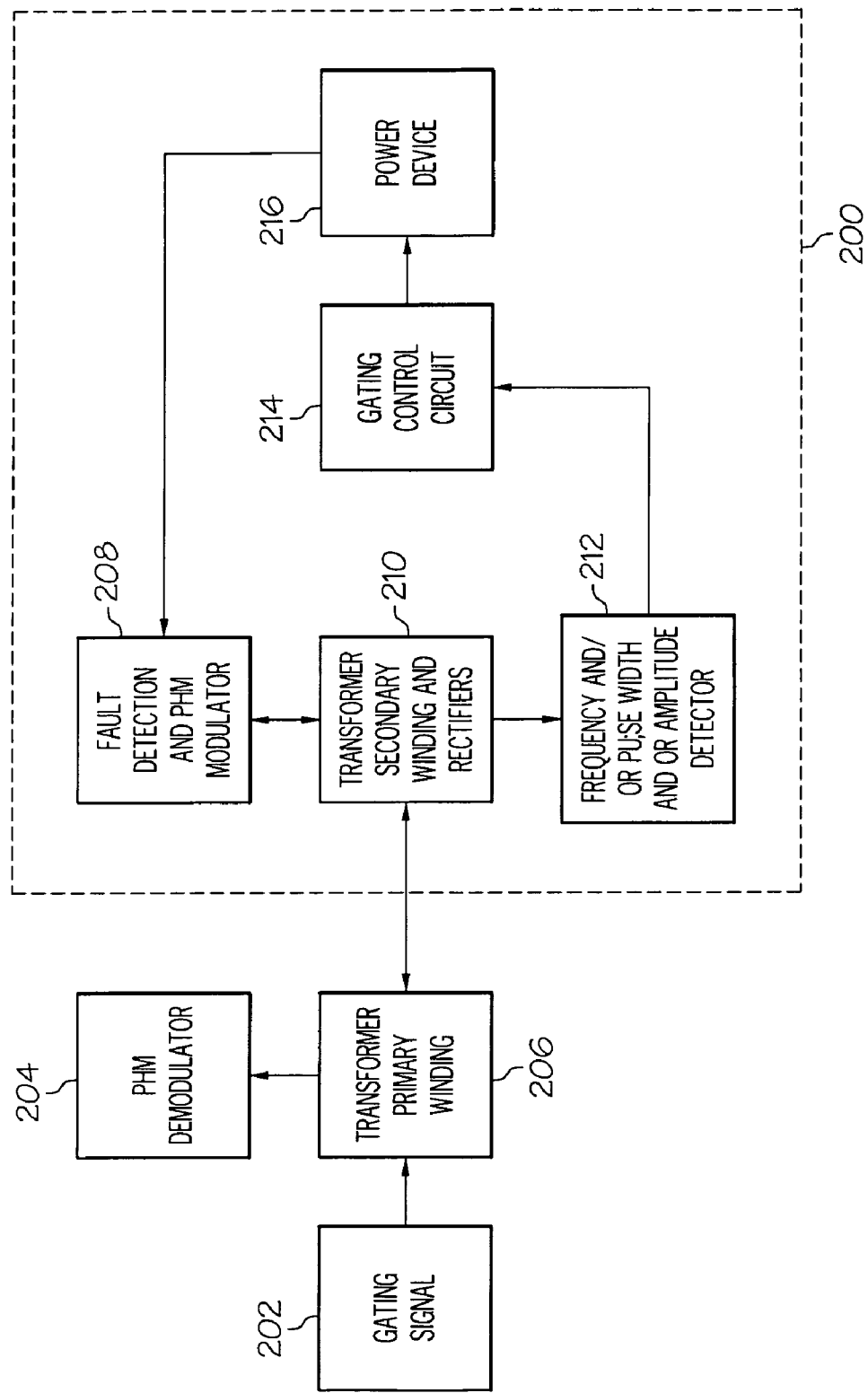
FIG. 2 is a block diagram of an integrated Gate Driver and Power Device according to the present invention.

With regard to FIG. 2, a Gate Driver circuit block 200 may be employed to provide controlled ON/OFF positive and negative, respectively, Gate Drive to a Power Device block 216, such as an IGBT or a power MOSFET. Power Device block 216 may be used in a variety of applications which require switching devices capable of withstanding significant voltages. In FIG. 2, a gating signal block 202 may provide an alternating current to a transformer primary winding block 206. As embodied here, the transformer primary winding block 206 providing the alternating current to a sealed gate drive unit, wherein the transformer primary winding block 206 is magnetically coupled to and physically isolated from the sealed integrated gate drive and Power Device unit through the core.

A transformer secondary winding and rectifiers block 210 may convert the AC signal into a high and low voltage direct current (DC) of V+ and V− power supplies which are used to turn-on the device and keep the device in the off position, respectively according to the gating signal. The high voltage DC may provide power to energize Power Device block 216 and may thereby enable conduction of load current between the current carrying terminals of the Power Device block 216.

Because of the inherent gate capacitance of a power semiconductor, it may be necessary to control the energization and de-energization rate of Power Device block 216. A gating control unit block 214 may control energization and de-energization of Power Device block 216.

When the high voltage DC may be supplied to Power Device block 216, a Fault Detection and PHM (prognostics health monitoring) Modulator block 208 may measure and determine if any of the key parameters such as the load current, device terminal voltage, power supply V+ voltage, device junction temperature, or other parameters of interest are out of range, in which case, a fault condition may be asserted and communicated by encoding and superimposing a signal through the secondary winding of the transformer. Thus any abnormal Gate Driver or Power Device condition such as its output state, high voltage DC power supply undervoltage, device over-temperature, overcurrent, and/or short circuit fault condition may be detected and the gating signals may be inhibited to prevent damage to the Gate Driver or Power Device. Depending upon the condition sensed, the Fault Detection and PHM modulator 208 may provide a unique Volt-seconds frequency change to the alternating current in transformer primary winding block 206 via a transformer secondary winding and rectifiers block 210. A PHM demodulator block 204 may compare the alternating current supplied to the transformer primary winding 206 and the current frequency change provided by the Fault Detection and PHM modulator block 208 and consequently may provide the corresponding fault signal to the up-stream system controller, which in turn may process the received fault information and make proper operational decision to stop operation in order to avoid cascading the fault problem to other functional blocks of the system. This is the frequency modulation encoding method for transmitting diagnostic data from the Gate Driver PHM Modulator block 208 to the PHM Demodulator block 204.

Alternatively, in the event of an over-temperature, overcurrent, undervoltage or short circuit fault in the gate drive or Power Device, a low resistance path that includes the transformer secondary winding and rectifiers block 210 may be created in the gate-drive circuit. This will result in an increase in current drawn from the transformer secondary winding and rectifiers block 210 and a corresponding increase in current from the transformer primary winding 206. Therefore, the Fault Detection and PHM Modulator block 208 may signal a fault condition by causing an increase in current of the transformer secondary winding and rectifiers block 210. This is the load variation method of encoding for transmitting diagnostic data from the Fault Detection and PHM Modulator block 208 to the PHM Demodulator block 204. Accordingly, the Frequency and/or Pulse Width and /or Amplitude Detector block 212 may ignore the actual gating signal command and instead change to bias the gating control circuit block 214 nonconductive to turn off the high voltage direct current power supply to ground and apply a guard voltage (a fast or slow transition from V+ to V−), thus preventing damage to Power Device block 216 when a fault condition exists.

Figure 3:
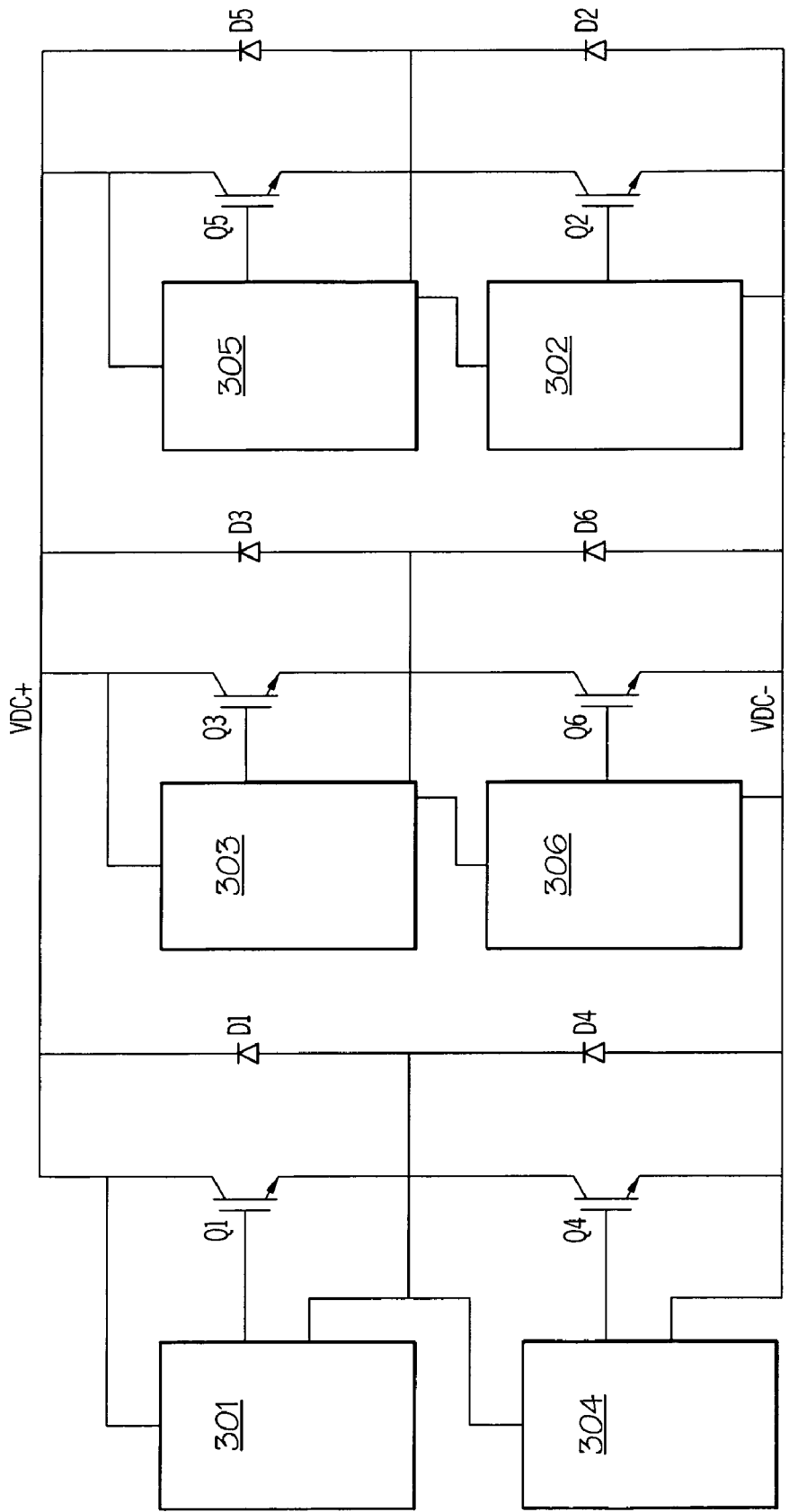
FIG. 3 is a block diagram and schematic of a typical 3-Phase Full Bridge Inverter.

With regard to FIG. 3, Gate Drivers 301-306 may provide gate control, drive and diagnostics for Power Devices Q1-Q6. The present invention may include the integration of Gate Drivers and Power Devices in different combinations such as one Gate Driver and one Power Device, two Gate Drivers and two Power Devices, four Gate Drivers and four Power Devices, six Gate Drivers and six Power Devices, or any other combination that maybe desirable based on topology and power rating.

In general, it may be possible to integrate 1 to N Gate Drivers with 1 to N Power Devices in an integrated N-pack device assembly and provide power, gating and diagnostics for all the N devices through m transformers where M can be 1 to N; 1 being the minimum and increased up to N, where one single transformer with one or multiple secondary windings, as explained above, can be used to achieve the task of transferring gating, power (for V+ and V−) and diagnostics to/from the N Power Devices. It can be appreciated that a lower choice of M than N would require more coding and decoding of the gating and diagnostics from one hand and more secondary windings on the other, and a judicious choice can be made through a technical trade-study considering complexity of coding/decoding process and the weight, size and cost of different options.

Figure 4:
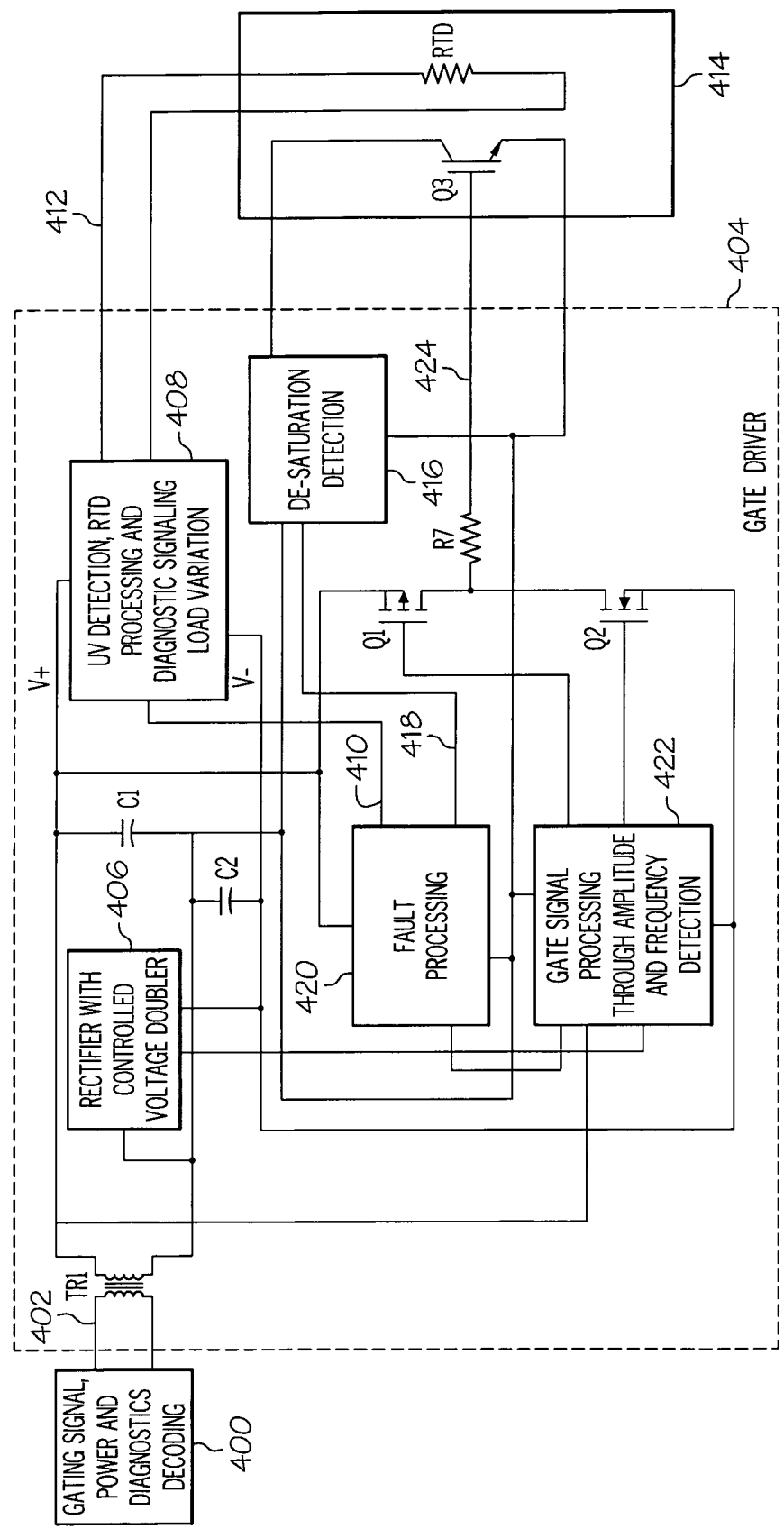
FIG. 4 is a block/circuit diagram of the method for incorporating the Gate Driver into the Power Device using a single transformer with only one primary and secondary winding according to the present invention.

With regard to FIG. 4, a block diagram/schematic representation of the current invention, the gating signal, power and diagnostics decoding block 400 may transmit the gating power and signal 402 to the Gate Driver 404 through transformer TR1 and receive diagnostic data/signal from the Gate Driver 404.

A rectifier with controlled voltage doubler block 406 may rectify and double the gating/power supply voltages (V+ or V−) signal 402 to generate the power supply voltages V+ and V− needed by the Gate Driver 404. The voltage doubler 406 may compensate for the gate signal 402 amplitude levels. This method may allow for amplitude differentiation of ON/OFF signals while maintaining constant high (V+) and low (V−) supplies. For example, the ON gating signal may be 15V and −10V with corresponding inversely proportional Pulse Widths (100 ns for the 15V and 150 ns for the −10V) while the OFF gating signal may be 7.5V and −10V with corresponding inversely proportional Pulse Widths (100 ns for the 7.5 V and 75 ns for the −10V). This technique may allow for ON/OFF detection based on amplitude, frequency and pulse width, any combination of which may be used to ensure that the ON/OFF command is decoded correctly. Capacitors C1 and C2 may provide filtering for V+ and V−.

A UV detection, RTD processing and diagnostic signaling load variation block 408 may monitor the V+ and V− voltages and generate a fault signal 410 if either V+ or V− is above or below certain limits. The block 408 may also process a signal 412 representing the resistance of an RTD which may represent the temperature of the Power Device Q3 and may encode and transform the UV, RTD and de-saturation signals into a Voltage or Current variation signaling scheme that is detected and decoded on the primary side of transformer TR1.

A de-saturation detection block 416 may compare the state of the Power Device Q3 output to the gate drive command and output and generate a fault signal 418 when the state of the Q3 Power Device output is different than that which is commanded. Traditionally, this was considered to cover a misfiring condition at the device level. Then, when one device fails and the complementary device is turned-on, there would be a shoot-through condition and could be detected through measuring the $V_{CE}$ voltage for an IGBT device. The fault signal processing block 420 may process all generated fault signals (e.g., fault signals 410, 418) and generate a common fault signal sent outside the Gate Driver 404 through the Diagnostic Signaling block 408, in addition the Fault Processing block 420 changes the state of the Gate Driver output in a manner that protects the Power Device Q3.

A gate signal processing through amplitude and frequency detection block 422 may determine the state of the Gate Driver output 424 based on the incoming gating signal amplitude and frequency and the state of the Gate Driver 404 as determined by the fault processing block 420. MOSFETS Q1 and Q2 may be the final drive stages of the Gate Driver 404. When Q1 is conducting, V+ may be applied to the gate 424 of Q3, when Q2 is conducting, V− is applied to the gate 424 of Q3.

Figure 5:
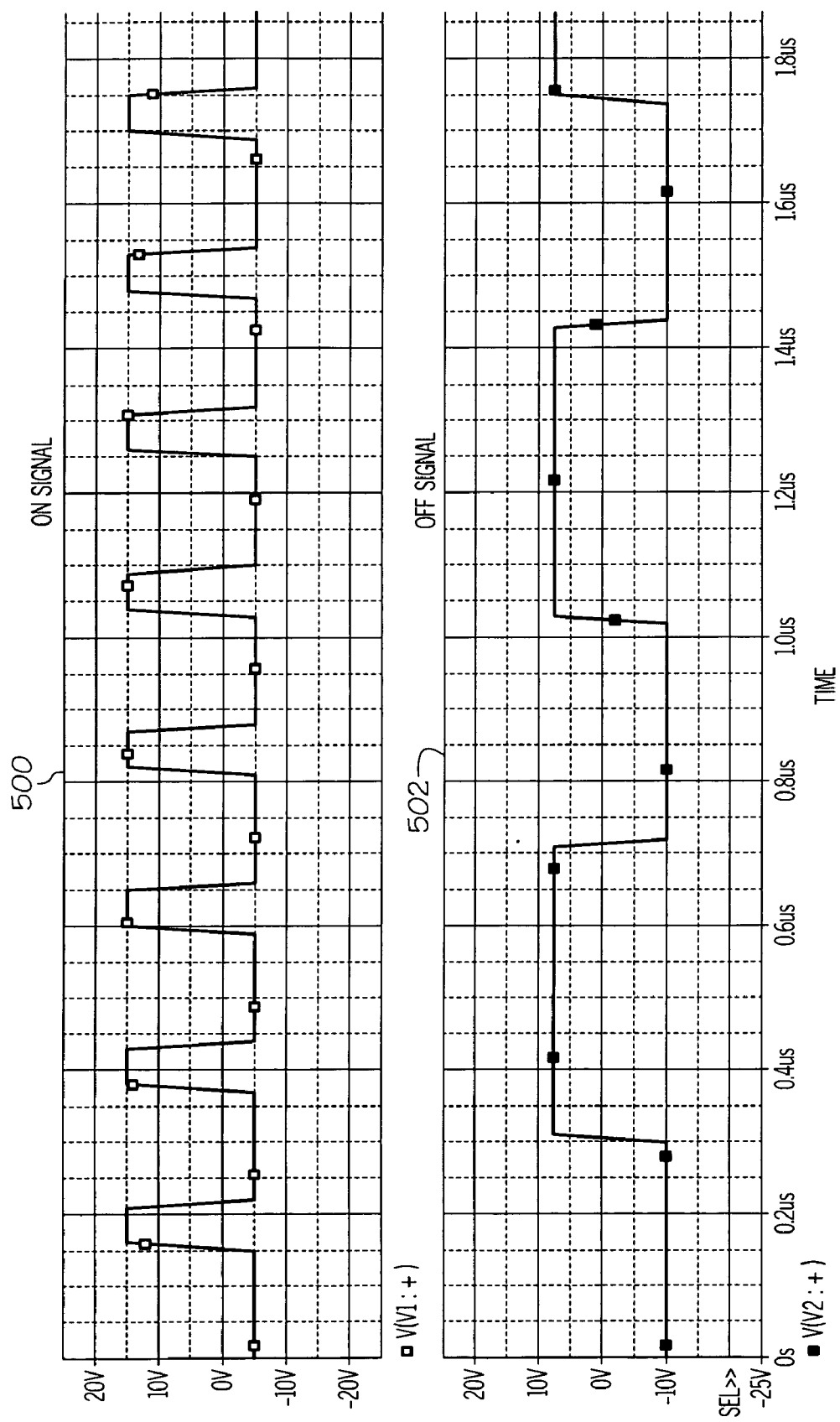
FIG. 5 is a waveform at the input of the primary of the transformer shown in FIG. 4, for transferring Gating, V+ and HV− power into and diagnostics feedback out of the Integrated Gate Driver and Power Device module, according to a method of the present invention.

With regard to FIG. 5, for the purpose of illustration typical waveforms of the gating/power signal of according to one aspect of the current invention are shown at the primary side of TR1 for FIG. 4. The top waveform 500 may be the ON signal with a positive level of 15V and pulse width=50 ns and a negative level voltage of −5V and pulse width=150 ns. The positive and negative volts-seconds are kept equal to avoid saturation of the transformer TR1. The frequency of this signal may be 5.0 MHz, however the current invention does not specify or limit the frequency range for the ON/OFF signals. FIG. 5 is one example of how the current invention may work and demonstrates the principle of volt-seconds balance with unbalanced positive and negative levels and pulse widths. The bottom waveform is of a pulse with a positive amplitude of +7.5V and 400 ns pulse width and a negative amplitude of −10V and 300 ns pulse width. The frequency is 1.428 MHz. It is clear that the ON/OFF waveforms can be differentiated by frequency, amplitude and pulse width, any combination of which may be used to ensure correct decoding of the ON/OFF gating signal.

Figure 6:
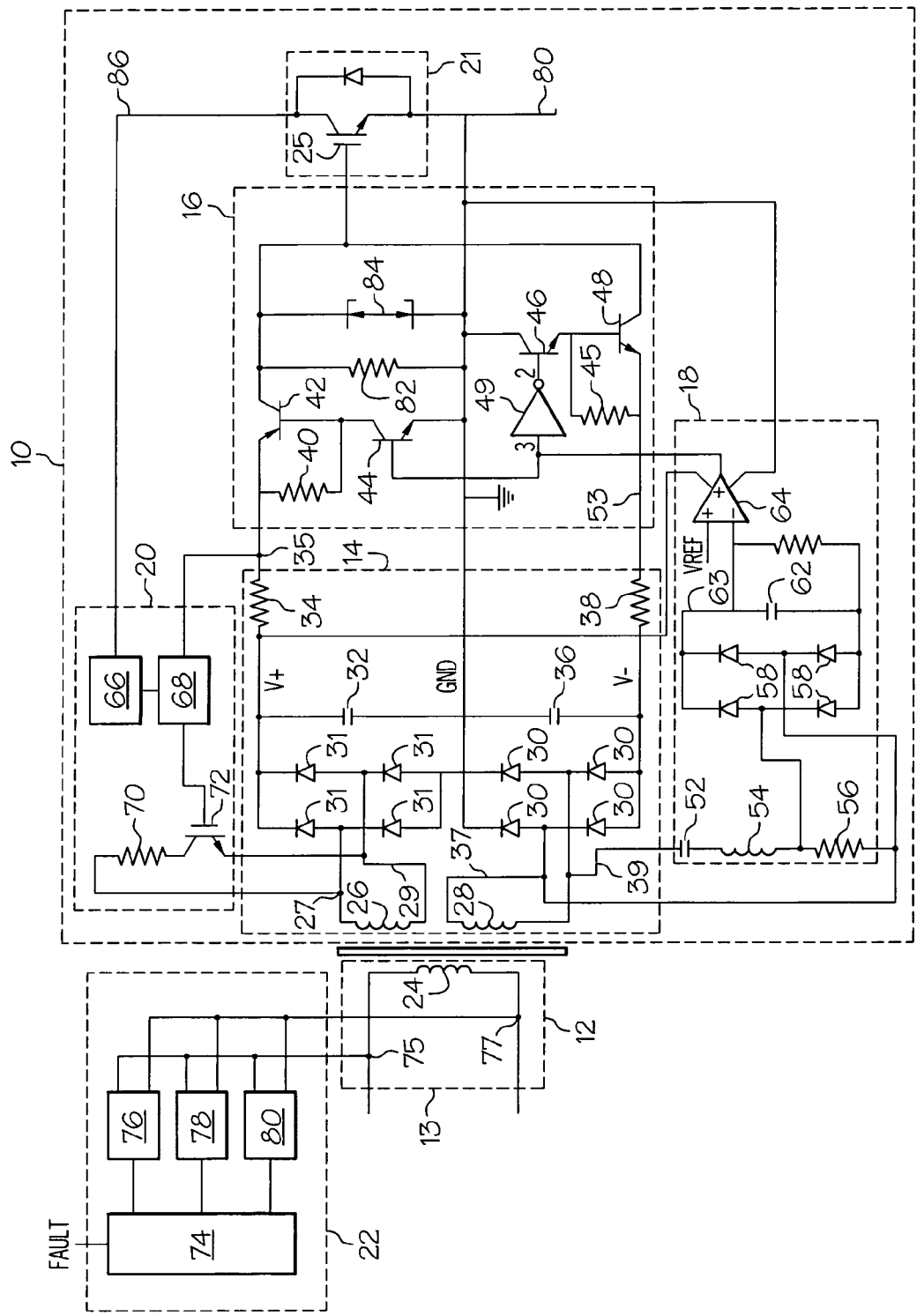
FIG. 6 is a top-level functional circuit diagram detailing an alternate preferred implementation for incorporating the Gate Driver into the Power Device using a single transformer with one primary and two secondary windings, according to the current invention.

With regard to FIG. 6, and to the particulars of circuit 10 of FIG. 2, carrying out the functions as described in FIG. 1 and FIG. 4, an alternate method/circuit diagram of the integrated Gate Driver power block is shown, which facilitates ease of achieving a sealed integrated Gate Driver/Power Device block as previously explained above.

A gating signal in the form of an alternating current, such as in FIG. 5, supply 13 may be applied to a primary transformer winding 24 and may induce an alternating current in the transformer secondary winding and rectifiers block 14. The transformer secondary winding and rectifiers block comprises a secondary transformer winding 26 having a corresponding set of secondary transformer rectifiers 31 and a tertiary transformer winding 28 having a corresponding set of tertiary transformer rectifiers 30. The secondary transformer winding 26 and tertiary transformer winding 28 may step up or step down, respectively, the alternating current from the primary transformer winding 24 according to the turns ratio on each of the windings.

The alternating current may be applied via primary transformer winding 24 to the secondary transformer winding 26 and may be stepped up to a high voltage alternating current of about |V+| alternating peak (typically, 15V) VAC and rectified to a high voltage direct current of about V+ (typically, +15) VDC by the corresponding set of secondary transformer rectifiers 31. The alternating current may also be applied via primary transformer winding 24 to a tertiary transformer winding 28 and may be stepped down to a low voltage alternating current of about |V−| alternating peak (typically, 10V) VAC and rectified to a low voltage direct current of about V− VDC by the corresponding set of rectifiers 30.

Alternatively, secondary transformer winding 26 and tertiary transformer winding 28 may be replaced by a single secondary transformer winding as shown in FIG. 4 and using the waveform of FIG. 5 or similar concept, produce the desired +15 VDC and −10 VDC voltage power supplies to integrate and address various power requirements of the integrated gate-driver and Power Device module in a sealed unit, according to one aspect of the present invention.

The voltage level at a high voltage node 35 may serve as a voltage supply and reference for a PHM modulator monitor 68 and as a high voltage supply to gating control unit block 16. Filter capacitors 32 and 36 may eliminate high and low voltage spikes, ripple, respectively. It should be noted that with respect to ground symbols as depicted in the FIG. 6, there exists between the transformer secondary winding and rectifiers block 14 and the gating control unit block 16 a local ground that may be a common connection for Power Device block 21 and gating control unit block 16.

When the gating control signal supplied by any combination of frequency, pulsewidth and amplitude variation detection unit block 18 may cause gating control circuit unit block 16 conductive, i.e. to supply the Gate 25 of device 21 a high (V+, typically 15 VDC) or low (V−, typically −10 VDC) power direct current voltage through resistors 34 and 38. This is the main function of the Gate Driver which results in making the Power Device 21 conductive, or ON, or non-conductive, OFF.

As described above, Power Device block 21 may be de-energized in the event of an over-temperature, overcurrent, undervoltage or short circuit fault in the Gate Driver or Power Device. A PHM encoder 66 may receive an analog or discreet signal from the Gate Driver, such as Gate Driver undervoltage, Power Device de-saturation, Power Device temperature or over-temperature. These signals are encoded and translated into load variation signaling by 68, 70 and 72. This load variation is detected on the primary of transformer 24 and is used for diagnostics and control as part of the overall system for the purpose of protection and health monitoring.

Under normal operation, when Power Device block 21 is conductive, ON, the voltage difference between the current carrying terminals node 80 and node 86 may be substantially above a specified limit, usually described as the saturation voltage. The difference between the Power Device block 21 voltage output from node 80 to node 86 may be compared at node 86, since node 80 is the common ground, with a reference in block 66 and generate a discrete fault signal generally described as de-saturation detection or fault.

An over-temperature, overcurrent, undervoltage or short circuit fault condition may also be sensed from node 86 and node 80 to generate a plurality of discrete signals to PHM encoder 66. Such a fault condition may result in a plurality of pulse signals generated by PHM encoder 66 to PHM load variation generator 68. In addition to a fault condition, the PHM may generate a sequence of discreet signals to represent the temperature of the Power Device.

The Voltage or Current variation generated by the PHM modulator node 27 to node 29 will induce a load variation in the primary winding of the transformer which may be detected as a voltage drop across a series resistor in the primary winding path or across nodes 75 and 77. This load variation may be detected as amplitude or frequency modulation by the PHM demodulator on the primary side of the transformer to provide diagnostic information on the status of the Gate Driver and Power Device to the controlling system.

Under normal operation, the tertiary transformer winding 28 may supply a low voltage alternating current power supply to the frequency variation detection unit block 18 across a gating frequency node 37 and gating frequency node 39. The detection mechanism for the gating control signal may comprise an RLC filter for frequency detection, a peak amplitude detection circuit, a pulse-width detection circuit, or any combination thereof. A frequency selected voltage may be generated by the RLC circuit combination of capacitor 52, inductor 54 and resistor 56 and sent to a set of rectifiers 58. The rectified output is filtered by capacitor 62 and then compared to a reference voltage Vref. 63 at comparator 64. The comparator output is then used to determine the output of the Gate Driver that is applied to the Power Device. When the comparator output is high, transistors 44 and 42 are conducting and V+ (typically +15 VDC), node 35 voltage, is applied to the gate of the Power Device. When the comparator output is low, transistors 46 and 48 are conducting and V−(typically −10 VDC), node 53 voltage, is applied to the gate of the Power Device.

The present invention also relates to a Gate Driver for interfacing with a gating signal and a high Power Device comprising a gating signal block, a single transformer primary winding block electrically coupled to and physically isolated from a sealed gate drive unit for use in a high Power Device module. In another embodiment, the sealed gate drive unit for use in a high Power Device module may be hermetically sealed.

The present invention also generally relates to a method for interfacing with a gating signal and a high Power Device, such as an IGBT or MOSFET, using a Gate Driver comprising the steps of providing an alternating current to a single transformer primary winding block; and providing the alternating current to a sealed gate drive unit using the single transformer primary winding block, wherein the single transformer primary winding block is electrically coupled to and physically isolated from the sealed gate drive unit.

An aspect of the method may include signaling gate control and gate drive and Power Device diagnostics by modulating an alternating current frequency in the single transformer primary winding block.

As can be appreciated by those skilled in the art, the present invention may provide an improved high Power Device Gate Driver and a method for use thereof, wherein the Gate Driver may provide isolated high and low voltage power supplies via a single transformer and may integrate gate control and Gate Driver and Power Device diagnostic signaling in a sealed Gate Driver unit that may be inexpensively sealed hermetically.

Figure 7A:
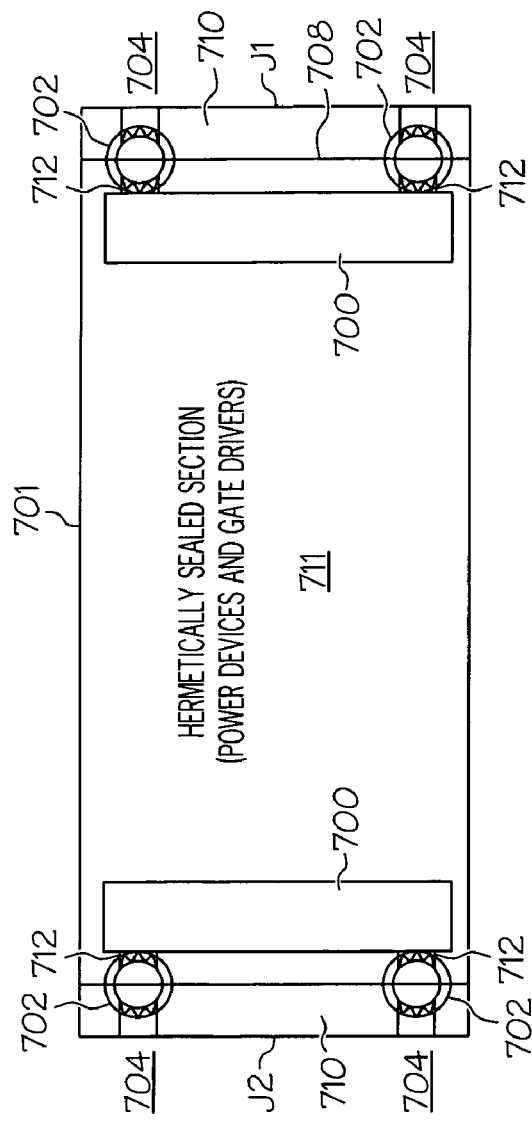
FIGS. 7A and 7B are pictorial diagrams detailing the integrated Gate Driver Power Device module.
Figure 7B:
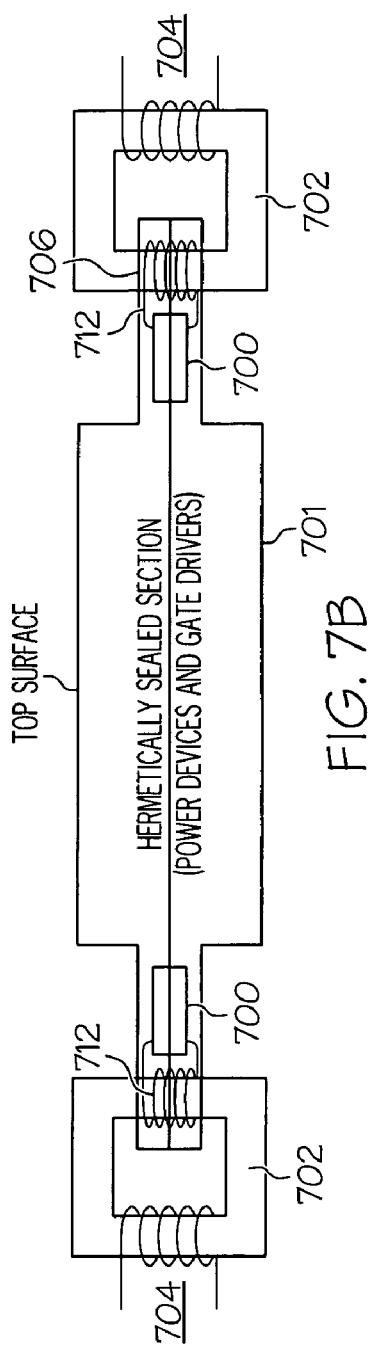

With regard to FIG. 7A and 7B, two specific detailed implementation methods for sealing the Gate Driver when integrated to the Power Device are depicted. The Gate Drivers 700 may be integral to the package 701. Power, gating and status signals at primary windings 704 may be magnetically coupled through the transformer cores 702 to the secondary windings 712. In FIG. 7A the boundary 708 between the sealed and unsealed sections is a plane vertical to the surface and through the centre of the transformer cores. The transformer cores may be the means of interfacing between the sealed section 711 and unsealed sections 710 of the package 701. The unsealed sections 710 may be separate entities attached to the sealed section 701 by using split cores or the unsealed sections 710 and sealed section 701 may be a single physical entity with the Transformer cores as the interface medium between the two.

In FIG. 7B the Transformer core is external, it may couple the primary windings 704 and the secondary windings 712 through a hole perpendicular to the top surface of the package 701. Secondary windings 712 may be built in, whereas cores 702 and primary windings 704 may be built in or are added externally. Shape and location of hole paths 706 and cores 702 may be chosen for ease of hermeticity and to avoid shorting the transformer. The cylindrical or other shape hole paths 706 may be positioned in the corners of the package 701 so as not to interfere with the main power package. Short circuits should be avoided around the hole paths 706 for the magnetic core. The magnetic cores 702 maybe completely built in, partially built in, or completely external.

It should be understood, of course, that the foregoing relates in detail to the best mode of carrying out the invention and that those skilled in the art to which this invention relates will recognize various alternative designs and embodiments and that modifications may be made without departing from the spirit and scope of the invention as set forth in the following claims.

We claim:

1. An isolated Gate Driver for interfacing with a gating signal to a high Power Device comprising:
   a single transformer with a single interface for Power, Gating Signal and Diagnostics;
   the transformer having its secondary winding in a hermetically sealed package that also contains the high Power device and the Gate Driver;
   the transformer having its primary winding outside of the sealed package;
   a gating signal, power and diagnostics decoding block being connected to the primary winding of the transformer;
   the gating signal, power and diagnostics decoding block being outside of the sealed package;
   the gating signal, power and diagnostics decoding block a transmitting power and gating signal and encoding diagnostics, with waveforms having unequal amplitudes and pulse-widths, yet balanced in terms of Volts-seconds
   the waveforms having pulses with their positive voltage amplitude differing from their negative voltage amplitude and said pulses differing in pulse width from one another as a function of a difference between their respective positive voltage amplitudes and their respective negative voltage amplitudes;
   wherein a pulse having its positive voltage amplitude higher than its negative voltage amplitude has its negative voltage pulse width greater than its positive voltage pulse width;
   wherein a pulse having its negative voltage amplitude higher than its positive voltage amplitude has its positive voltage pulse width greater than its negative voltage pulse width;
      wherein the waveforms can be differentiated by frequency, amplitude and pulse width, any combination of which may be used to ensure correct decoding; and
      wherein a volt-second product of successive pulses is balanced.

2. An isolated Gate Driver for interfacing with a gating signal to a high Power Device comprising:
   a single transformer interface for Power, Gating Signal and Diagnostics:
   a transformer configuration using a core to facilitate sealing of the gate Driver from a Control Section and sealing of a Power
   Power Device from the Control section wherein the Gate Driver is integrated with the Power Device;
   a Gating Signal waveform transmitting power and gating signal and encoding diagnostics, with unequal amplitudes and pulse-widths, yet balanced in terms of Volts-seconds,
   wherein the Gate Driver and Power Device are integrated and, hermetically or not, sealed into a sealed gate driver unit;
   wherein the sealed gate drive unit comprises:
   a transformer secondary winding and rectifiers block receiving the alternating current from a transformer primary winding block and converting the alternating current to a high and low voltage direct current power supply of different magnitudes without the use of voltage regulators;
   a prognostics health monitoring modulator block providing gate driver and Power Device diagnostic signals;

a frequency, pulsewidth, amplitude, or combination thereof, variation detection unit providing a gating control signal;

a gating control unit block simultaneously receiving the high and low voltage direct current power supply from a transformer secondary winding and rectifiers block and the gating control signal from the frequency, pulsewidth, amplitude, or combination thereof, variation detection unit and biasing conductive and nonconductive the high and low direct current power supply;

a prognostics health monitoring demodulator block receiving diagnostic signals from the prognostics health monitoring modulator block and the frequency or amplitude variation detection unit and providing an alarm when a fault condition exists; and, a Power Device block receiving the high voltage direct current power supply from the transformer secondary winding and rectifiers block.

3. The Gate Driver of claim 2, wherein:

a secondary transformer winding and a corresponding set of secondary transformer rectifiers in the transformer secondary winding and rectifiers block receiving the alternating current from a primary transformer winding in the gating transformer primary winding block, stepping up or down the alternating current to a high voltage alternating current and rectifying the high voltage alternating current to a high voltage direct current power supply and, wherein a tertiary transformer winding and a corresponding set of tertiary transformer rectifiers in the transformer secondary winding and rectifiers block receiving the alternating current from the primary transformer winding, stepping down the alternating current to a low voltage alternating current and rectifying the low voltage alternating current to a low voltage direct current power supply.

4. The Gate Driver of claim 3, wherein the secondary transformer winding receiving the alternating current from the primary transformer winding and stepping up or down the alternating current voltage to a high voltage alternating current of appropriate Voltage, typically 5-15 VAC, squarewave to the corresponding set of secondary transformer rectifiers and rectifying the high voltage alternating current to a high voltage direct current of V+ of about +15 VDC, direct current and, wherein the tertiary transformer winding receiving the alternating current from the primary transformer winding and stepping down or up the alternating current to a low voltage alternating current of appropriate Voltage of about 5-10 VAC, squarewave to the corresponding set of tertiary transformer rectifiers and rectifying the low voltage alternating current to a low voltage direct current V−, of about −10 VDC.

5. The Gate Driver of claim 3, wherein the secondary transformer winding stepping up or down and tertiary transformer winding stepping up or down, respectively, the alternating current according to the turns ratio on each of the windings.

6. The Gate Driver of claim 3, wherein the secondary transformer winding and the tertiary transformer winding may be combined into a single secondary transformer winding having a plurality of sections on a single core wherein the winding turns ratio on each of said core sections is different, thereby providing a single secondary transformer winding capable of providing a plurality of power supplies.

7. The Gate Driver of claim 2, wherein the prognostics health monitoring modulator block is coupled to the high voltage alternating current power supply, transmitting the diagnostic signal or signals as a Voltage, Current or frequency change via the secondary transformer winding, transmitting the encoded signal or signals to the high voltage alternating current power supply to the primary transformer winding;

the prognostics health monitoring demodulator block is coupled to the alternating current from the gating signal block, receiving the diagnostic signals on the primary transformer winding from the secondary and tertiary transformer windings.

8. The Gate Driver of claim 2, wherein the prognostics health monitoring modulator block comparing the Power Device current output and the high voltage direct current from the gate drive to the Power Device and determining if an over-temperature, overcurrent, Undervoltage, short circuit or any other fault or status condition in the gate drive or Power Device exists.

9. The Gate Driver of claim 2, wherein the frequency or amplitude variation detection unit block comparing the low voltage alternating current power supply and a reference voltage and, determining that a fault condition in the gate drive or Power Device exists, providing a frequency, pulsewidth, amplitude, or any combination thereof, change to bias the gating control unit nonconductive.

10. The Gate Driver of claim 9, wherein the frequency, pulsewidth, amplitude, or any combination thereof, variation detection unit providing a normal condition bias conductive resonant frequency f1, amplitude A1, pulsewidth PW1, or any combination thereof, thereby biasing the gating control unit conductive to the Power Device block and providing a fault condition bias nonconductive frequency of f2, amplitude A2, pulsewidth PW2, or any combination thereof, thereby biasing the gating control unit nonconductive to the Power Device block.

11. A method for interfacing with a gating signal and an IGBT or MOSFET high Power Device using a Gate Driver comprising the steps:

providing an alternating current to a single transformer primary winding block; and providing the alternating current to a hermetically sealed gate drive unit using the single transformer primary winding block, wherein the single transformer primary winding block is magnetically coupled to and physically isolated from the sealed gate drive unit;

inducing an alternating current in a primary transformer winding from said alternating current;

inducing an alternating current in a secondary transformer winding and a tertiary transformer winding each from said alternating current in primary transformer winding;

stepping up or down the alternating current in the secondary transformer winding to a high voltage alternating current of appropriate Voltage amplitude of about 15 VAC;

rectifying the high voltage alternating current of appropriate Voltage amplitude of about 5-15 VAC, to a high voltage direct current V+ of about +15 VDC;

stepping up or down the alternating current in the tertiary transformer winding to a low voltage alternating current of appropriate Voltage amplitude of about 5-10 VAC;

rectifying the low voltage alternating current of appropriate Voltage amplitude of about 10 VAC to a low voltage direct current V− of about −10 VDC;

generating a gating signal and frequency control from said high and low voltage alternating current;

biasing conductive or biasing nonconductive said gating control from said gating signal and frequency control;

turning a Power Device on from biasing said gating control conductive;

generating a guard voltage from biasing said gating control nonconductive; and, keeping a Power Device turned off from said guard voltage;

wherein said steps are performed in a sealed Gate Driver unit.

12. The method of claim 11, further comprising generating a diagnostic signal or signals by comparing the state of the Power Device, the Voltage across the Power Device, to a fixed reference and the gating signal, ON (biased conductive), OFF (biased non-conductive).

modulating a Voltage, Current or frequency control in said high and/or low, voltage alternating current from said diagnostic signal or signals;

detecting a first frequency change in said supply alternating current from said fourth high voltage frequency change;

generating a fault signal to signal a gate drive and Power Device diagnostic fault condition from said first frequency change;

modulating frequency control in said low voltage alternating current from said generating a gating signal and frequency control, wherein said frequency control is a first Volt-seconds low voltage frequency change to the low voltage alternating current;

generating a fault signal to signal a gate control diagnostic fault condition from said second frequency change;

wherein said steps are performed in a sealed Gate Driver unit.

13. The method of claim 11, further comprising driving the single transformer primary winding block with unbalanced positive and negative voltages without saturating the transformer, by using unequal pulsewidths to equalize the Volts-seconds of the positive and negative amplitudes.

14. The method of claim 11, wherein a transformer and its core facilitates isolation and sealing of the Gate Driver from a low voltage control section.

\* \* \* \* \*